United States Patent
Etoh

(10) Patent No.: US 6,873,361 B1
(45) Date of Patent: Mar. 29, 2005

(54) IMAGE SENSOR HAVING A PLURALITY OF CHIPS

(75) Inventor: Takeharu Etoh, Mino (JP)

(73) Assignees: Takeharu Etoh, Osaka (JP); Shimadzu Corporation, Kyoto (JP)

( * ) Notice: Subject to any disclaimer, the term of this patent is extended or adjusted under 35 U.S.C. 154(b) by 0 days.

(21) Appl. No.: 09/647,219

(22) PCT Filed: Jan. 27, 2000

(86) PCT No.: PCT/JP00/00414

§ 371 (c)(1),
(2), (4) Date: Sep. 28, 2000

(87) PCT Pub. No.: WO00/45440

PCT Pub. Date: Aug. 3, 2000

(30) Foreign Application Priority Data

Jan. 28, 1999 (JP) .......................................... 11-020503

(51) Int. Cl.[7] ........................... H04N 3/14; H04N 5/335
(52) U.S. Cl. ................... 348/296; 348/162; 250/370.9; 378/98.8
(58) Field of Search ................................ 348/296, 162, 348/308, 302; 250/370.9, 370.01, 370.08; 378/98.8

(56) References Cited

U.S. PATENT DOCUMENTS 4,755,681 A * 7/1988 Oka et al. .............. 250/370.01
5,355,165 A    10/1994 Kosonocky et al.
5,783,865 A *  7/1998 Higashiguchi et al. ...... 257/774
5,894,143 A *  4/1999 Tanigawa et al. ........... 348/305
6,035,013 A *  3/2000 Orava et al. ........... 250/370.09

FOREIGN PATENT DOCUMENTS

| JP | 61-182164  | 11/1986 |            |
|----|------------|---------|------------|
| JP | 1-140649   | 6/1989  |            |
| JP | 3-50973    | 3/1991  |            |
| JP | 4-302164   | 10/1992 |            |
| JP | 06291248   | 10/1994 |            |
| JP | 60-291248  | * 10/1994 | ........... H01L/25/04 |
| JP | 0943558    | 2/1997  |            |

* cited by examiner

Primary Examiner—Tuan Ho
Assistant Examiner—Gevell Selby
(74) Attorney, Agent, or Firm—Birch, Stewart, Kolasch & Birch, LLP

(57) ABSTRACT

An image sensor (21) has a plurality of chips (31). Each chip (31) has a plurality of converter (33) for converting incident beams into electric signals and a plurality of electric signal storages (35). The converters (33) are arranged in one row or a plurality of rows in the vicinity of the first end portion (31a) of the chip (31). Each electric signal storage (35) extends from the converter (33) to the second end portion (31b) opposite to the first end portion (31a). The first end portion (31a) of each chip (31) is shifted relative to the first end portion (31a) of an adjacent chip (31) so that the row of the converters (33) of the respective chips (31) are stepwise exposed.

10 Claims, 19 Drawing Sheets

IMAGE SENSOR HAVING A PLURALITY OF CHIPS

This application is the national phase under 35 U.S.C. § 371 of PCT International Application No. PCT/JP00/00414 which has an International filing date of Jan. 27, 2000, which designated the United States of America.

TECHNICAL FIELD

The present invention relates to an image sensor suitable for continuous recording of a rapidly moving object, and to an image sensing apparatus comprising the same.

BACKGROUND ART

When image signals are read from the image sensor of an ordinary video camera, electric signals generated in several tens of thousands to several millions of pixels are read by scanning every one row of pixels and sequentially reading them from one electric signal read-out line. Therefore, it takes considerable time in reading the image signal, which makes it difficult to gain the recording speed.

On the other hand, an ordinary high-speed video camera achieves high-speed recording by providing a plurality of read-out lines on an image sensor, and scanning and reading out a plural number of rows of pixels at once.

To further speed up the recording out, all the pixels are processed in parallel. That is, several to several tens of electric signal-storage elements are arranged in the vicinity of each of all the pixels, and electric signals generated at once in the photodiodes for all the pixels are sequentially transferred to the electric signal-storage elements, and thus, the recording speed can be further increased.

For example, U.S. Pat. No. 5,355,165 discloses an image sensor which comprises, as shown in FIG. 19, one longitudinal photodiode 3, a CCD type memory and a horizontal read-out CCD 9, which are arranged for every one pixel 1. The CCD type memory comprises 6 rows of horizontal transfer CCDs 5 and 5 rows of vertical parallel CCDs 7 for memory. This image sensor achieves continuous record of 30 image frames achieved at a recording rate of several hundreds of thousands of sheets/sec.

However, the image sensor shown in FIG. 19 has a problem in that a plurality of electric signal-storage elements are needed for each of the pixels 1 in order to increase the number of picture sheets of continuous recording, which induces a further problem in that the pixel must have a larger size so as to increase the number of electric signal-storage elements. However, limitation in the area of a chip for an image sensor exists, and therefore, the number of pixels becomes smaller as the size of the pixel becomes larger, so that the spatial resolution of the image sensor degrades. To solve this problem, it is considered to provide a plurality of electric signal-storage elements extending downwardly from and perpendicular to an image sensing plane composed of pixels. However, in view of the level of the present technology, it is impossible to construct an image sensor having such a three-dimensional structure, using a single or one chip.

By contrast, there is proposed an image sensor which is constructed by laminating a single planar chip having an array of photodiodes formed thereon and a plurality of planar chips each having a plurality of electric signal-storage elements formed thereon to each other, and which transfers charges generated in the photodiodes in the vertical direction (i.e., the thickness direction of the chips).

Further, Japanese Laid-Open Patent Publication No. 3-50973 discloses an image sensor as shown in FIG. 20. The image sensor comprises a plurality of chips 11, each of which has a row of photodiodes 13 arranged on one end face thereof, and digital memory elements 15 provided to the photodiodes 13 at one to one. These chips 11 are laminated on one another to construct the image sensor. Every chip 11 of this image sensor functions as a linear sensor capable of continuously storing brightness information corresponding to several thousands of points in time. Therefore, the image sensor constructed by laminating a plurality of such chips 11 that serve as linear sensors can record several hundreds of consecutive picture sheets at ultra high speed. Light 17 comes into the photodiodes 13 on the end faces of the laminated chips 11 from a direction orthogonal to the faces of the chips 11.

However, it is difficult in view of the level of the present technology that the above-mentioned image sensor, constructed by laminating one planar chip having an array of the photodiodes formed thereon and the plurality of planar chips each having the electric signal-storage elements formed thereon to each other, carries electric charges in the vertical direction between each of the chips, with low noises.

With respect to the image sensor shown in FIG. 20, it is difficult to construct a photodiode with high accuracy and low noises capable of responding to the light 17 coming into the end face of the chip 11 from the direction parallel to the chip surface. Further, the image sensor of FIG. 20 requires a very large number of chips to arrange a photo-receptive area having a sufficient size or a sufficient number of pixels.

An object of the present invention is therefore to provide an image sensor capable of recording a sufficient number of continuous image frames and achieving high-speed recording with high accuracy and low noises.

DISCLOSURE OF INVENTION

To achieve the above object, the first invention provides an image sensor comprising a plurality of chips each having a plurality of converters for converting incident beams into electric signals and a plurality of electric signal storages, said converters being arranged in one row or a plurality of rows in the vicinity of the first end portion of the chip, said electric signal storages respectively having electric signal-storage elements for storing said electric signals, and each electric signal storage extending from the converter to the second end portion opposite to the first end portion of the chip, wherein the first end portion of each chip is shifted relative to the first end portion of an adjacent chip so that the row of the converters of the respective chips are stepwise exposed.

In the image sensor of the first invention, when the converters are arranged in one row, incident beams can come into the row of converters which are stepwise exposed, from a direction perpendicular to the faces of the chips.

When the converters are arranged in two rows and the same number of chips are used, the number of total pixels is two times larger than the number of pixels of the image sensor in which one row of converters is arranged. On the contrary, if the image sensor includes the same number of pixels, the number of chips required is a half of the number of chips of the image sensor in which one row of converters is arranged.

Further, in case where three or more rows of converters are arranged and the same number of chips are used, the number of pixels is three or more times larger than the number of pixels of the image sensor in which one row of converters is arranged. On the contrary, where the same number of pixels are used, the number of chips required is one third or less of the number of chips of the image sensor in which one row of the converters is arranged.

The image sensor of the first invention can be readily constructed in view of the level of the present technology. In addition, continuous recording of not less than several hundreds of image frames becomes possible by increasing the number of chips. Thus, high-speed recording capable of achieving low noises and high quality images with high accuracy can be realized.

The incident beams may be visible rays, or infrared rays, ultraviolet rays, X-rays, electron lines, ion beams, neuron lines or supersonic waves. In other words, there can be used a converter which converts infrared rays, ultraviolet rays, X-rays, electron lines, ion beams, neuron lines or supersonic waves other than visible rays into electric signals.

It is preferable that each of the chips has an input/output section in the vicinity of the second end portion thereof, and that the second end portion of each chip is shifted relative to the second end portion of an adjacent chip so that the input/output sections of the respective chips are stepwise exposed. In this case, the input/output sections can be readily connected to an external unit with low noises.

Further, there may be provided a fiber glass having a planar incident face and a stepwise outgoing face which is brought into tight contact with the above row of the converters of the respective chips. In this case, a planar image formed on the incident face of the fiber glass can enter the converters stepwise exposed, at right angles. In this regard, the outgoing face of the fiber glass can be jointed to the converters stepwise exposed with the use of, for example, an optical adhesive or an optical oil.

Further, the row of the exposed converters of the respective chips may be inclined with respect to the incident direction of the incident beams.

The second invention provides an image sensing apparatus comprising the above-mentioned image sensor.

The third invention provides a circuit element comprising a plurality of chips respectively having a parallel processing section arranged between the vicinity of the first end portion and the second end portion opposite to the first end portion of the chip, and an input/output section arranged in the vicinity of the second end portion, wherein the first end portion of each chip is shifted relative to the first end portion of an adjacent chip so that the parallel processing sections of the respective chips are partially and stepwise exposed, and wherein the second end portion of each chip is shifted relative to the second end portion of the adjacent chip so that the input/output sections of the respective chips are stepwise exposed.

The circuit element of the third invention can be readily connected to an external circuit with low noises because the input/output section of each chip is stepwise exposed as mentioned above.

BEST MODE FOR CARRYING OUT THE INVENTION

First Embodiment

Figure 1:
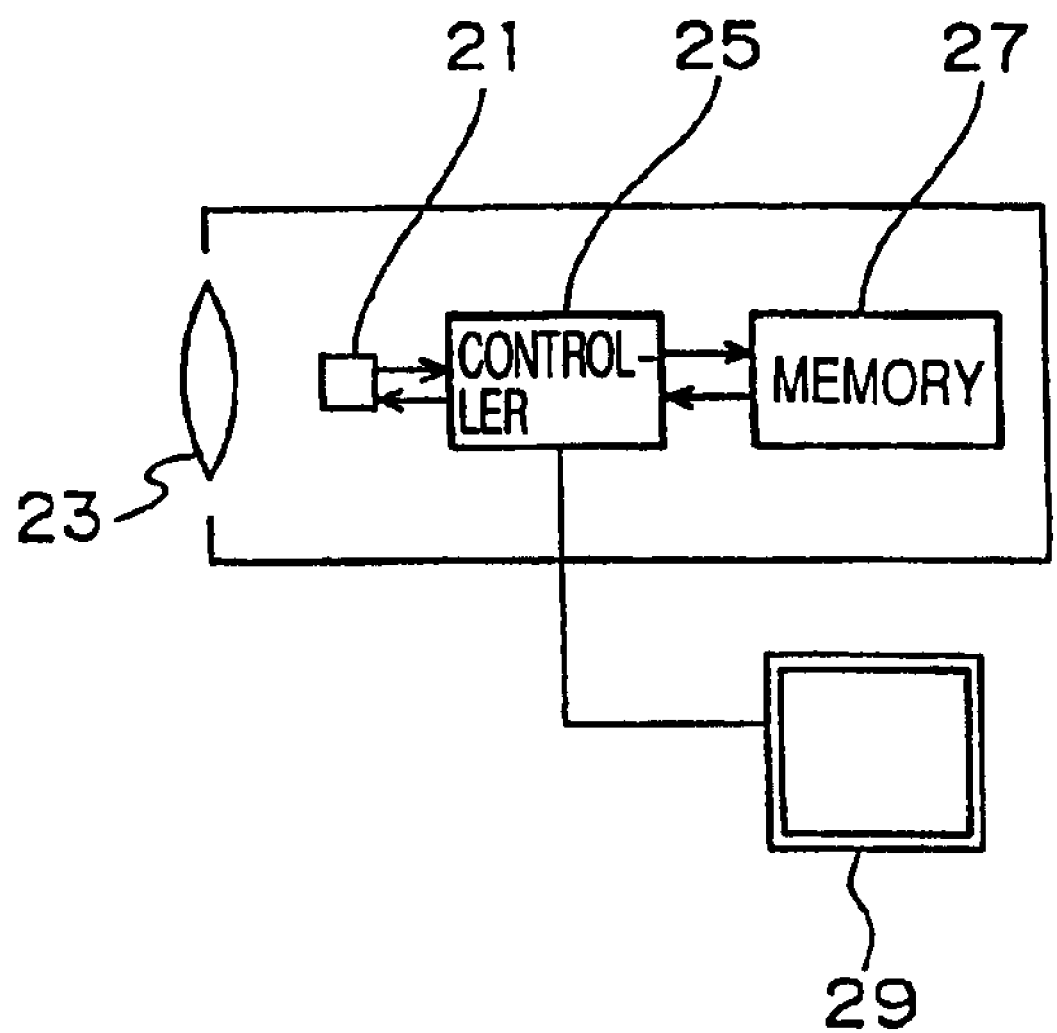
FIG. 1 is a schematic diagram illustrating an image sensing apparatus comprising an image sensor according to the first embodiment of the present invention.

FIG. 1 shows an image sensing apparatus which comprises an image sensor 21 according to the first embodiment of the present invention, a lens 23, a control unit 25 for the image sensor 21, a memory 27, and a monitor 29.

Figure 2:
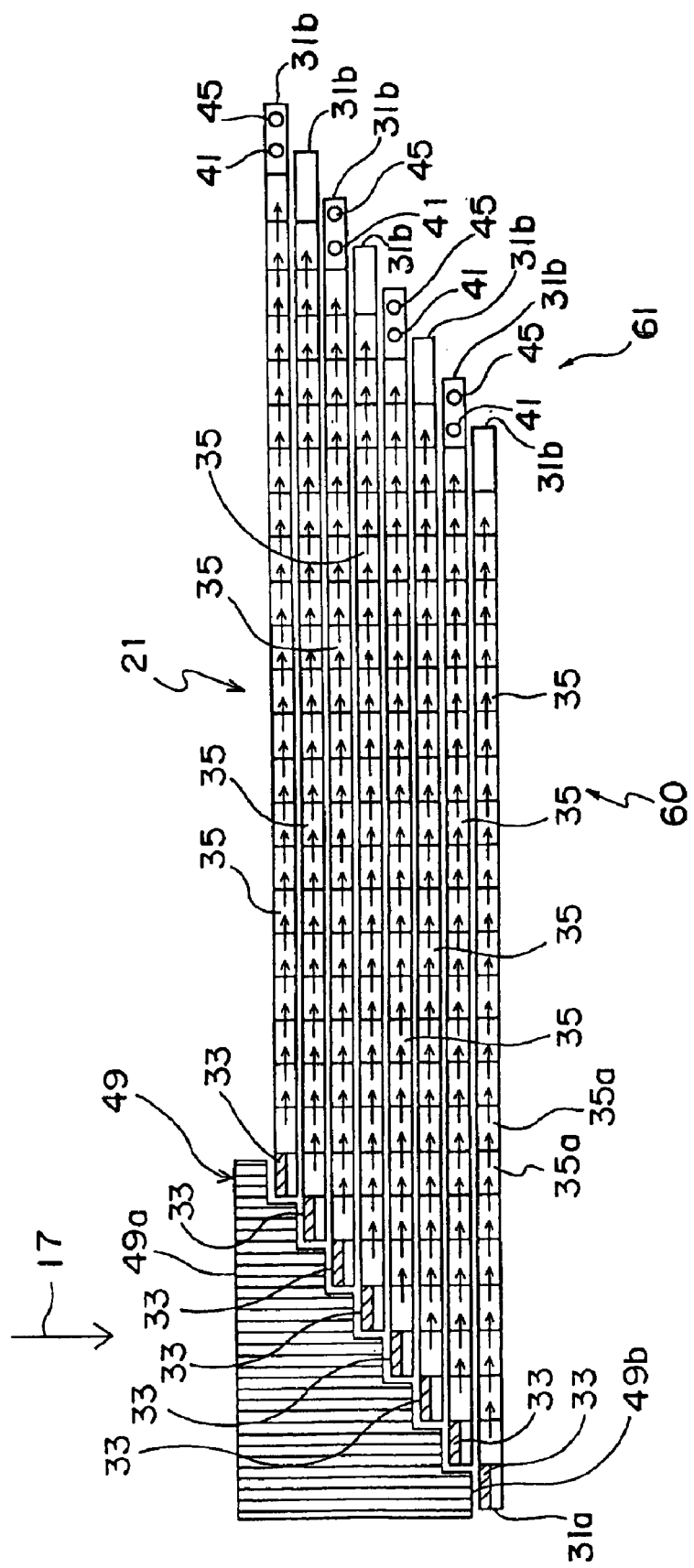
FIG. 2 is a schematic partial side view of a half portion of the image sensor according to the first embodiment.
Figure 3:
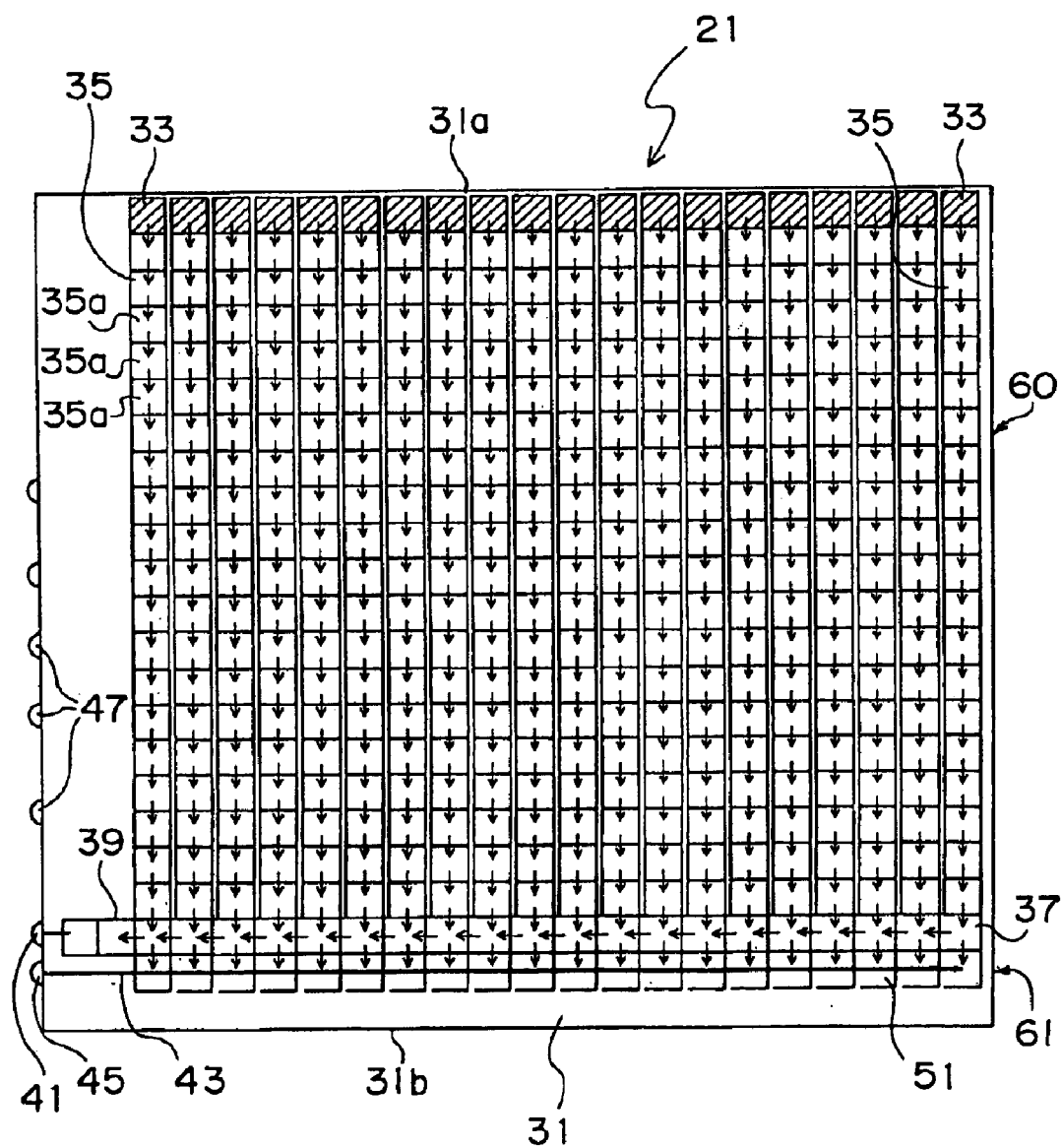
FIG. 3 is a plan view of one of chips comprised in the image sensor according to the first embodiment.
Figure 4:
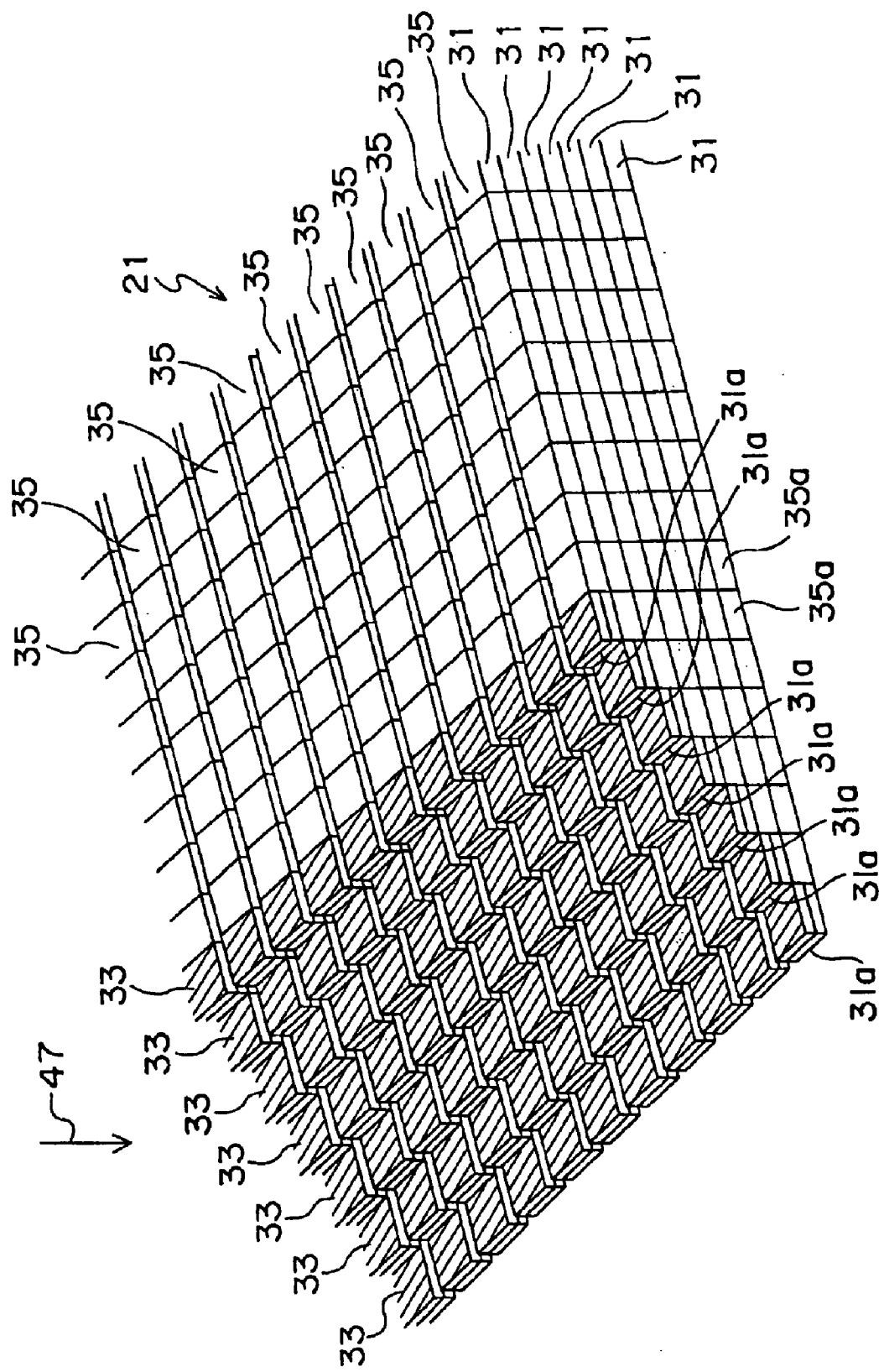
FIG. 4 is a partial perspective view of the image sensor according to the first embodiment.

As shown in FIGS. 2 to 4, the image sensor 21 is composed of a lamination of a plurality of planar chips 31. As will be described later, two image sensors 21 are combined with each other to provide one image sensor. In these figures, the number of the chips 31 laminated and the numbers of CCDs and the like are schematically shown.

The photodiodes 33 constituting converters are arranged in one row along one side of edges of the respective chips 31 (the first end portions 31a). Vertical CCD transfer paths 35, each formed in the shape of a straight line and constituting an electric signal-storage, are respectively connected to the photodiodes 33. Each of the vertical CCD transfer paths 35 comprises a plurality of CCD elements 35a. Such photodiodes 33 and vertical CCD transfer paths 35 compose a parallel processing section 60.

In the vicinity of the other ends of the respective chip 31 (the second end portions 31b) opposite to the first end portions 31a on which the above row of photodiodes 33 are arranged, a single horizontal CCD transfer path 37, a read-out gate 39, a read-out terminal 41, a drain line 43 and a drain terminal 45 are arranged. In this embodiment, the read-out terminal 41 and the drain terminal 45 are provided on a side end face of each chip 31a. Other terminals 47 for applying drive voltage to the vertical CCD transfer paths 35 and the like are also provided on the side end face of each chip 31. The horizontal CCD transfer path 37, the read-out gate 39, the read-out terminal 41, the drain line 43, the drain terminal 45 and the other terminals 47 compose an input/output section 61.

These chips 31 are laminated on one another so that the row of the photodiodes 33 of the respective chips 31 are so exposed as to form a stepwise photo-receptive area. In detail, the first end portion 31a of each chip 31 is shifted to the left relative to the first end portion 31a of an adjacent chip 31 at the upper side in FIG. 2, and thus, the row of the photodiodes 33 of the respective chips 31 are stepwise exposed.

A fiber glass 49 having a planar incident face 49a and a stepwise outgoing face 49b for the light 17 is mounted on the above stepwise photo-receptive area. The outgoing face 49b of the fiber glass 49 is connected to and brought into tight contact with the photo-receptive area, using an optical adhesive, optical oil or the like.

Figure 5:
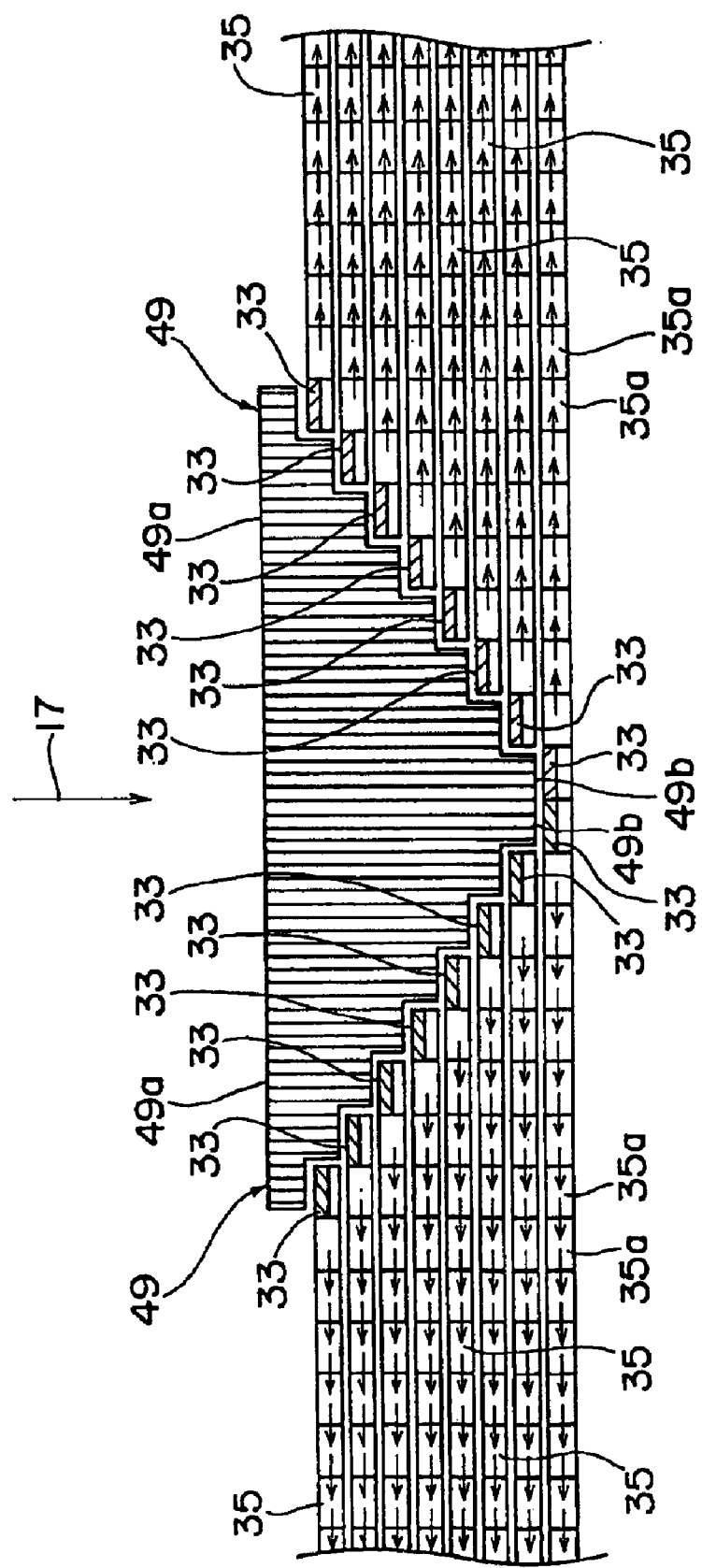
FIG. 5 is a schematic partial side view of the image sensor according to the first embodiment.

Each of the chips 31 is coated with a light-screening layer (not drawn) except for the portion corresponding to the photodiodes 33. In this embodiment, the pitch between the pixels is 40 microns; and the pitch between the CCDs, 40 microns in the horizontal direction and 10 microns in the vertical direction. The number of the photodiodes 33 of one chip 31 is 256, and the number of the chips 31 is 128. Two image sensors 21 are matched with each other as shown in FIG. 5 for use as one image sensor. Therefore, the number of pixels is 256×256 (=65, 536). Further, the size of the photo-receptive area is 10.24 mm×10.24 mm. The number of consecutive image frames is 1,024 which is four times of 256.

The thickness of each chip 31 is 200 microns, and therefore, the minimal interval between each of the terminals of the image sensor constituted by laminating the chips 31 is 200 microns.

There are used two types of chips 31. Namely, as shown in FIG. 3, one type of the chip 31 has the read-out gate 39, the read-out terminal 41, the drain line 43 and the drain terminal 45 on the left edge portion thereof, and the other type of chip 31 has these elements such as the read-out gate 39 on the right edge portion thereof. These two types of chips 31 are alternately laminated on one another. Therefore, the pitch between each of the read-out terminals 41 is 400 microns. The pitch of about such length between each of the terminals allows easy bonding between a package (not drawn) and the image sensor. Reading lines (not drawn) which are respectively connected to the read-out terminals 41 are separately drawn out one by one so that image signals from the respective chips 31 are not confused to one another. The other terminals 47, located on the same or corresponding positions on the respective chips 31, are connected to an identical line, which is then drawn out from the image sensor. This is because, for example, drive voltage patterns to be fed to the vertical CCD transfer paths 35 are the same to all the chips 31.

During image sensing, an image formed on the incident face 49a of the fiber glass 49 comes into the photodiodes 33. Electrons generated in each photodiode 33 are transferred on corresponding vertical CCD transfer path 35.

After transferred to the lower end of the vertical CCD transfer paths 35, the electrons are transferred to the horizontal CCD transfer path 37, and further transferred to the drain 51 which is arranged one stage below the horizontal CCD transfer path 37. Thus, the electrons are discharged from the image sensor through the drain terminal 45 via the drain line 43.

With reference to FIG. 3, there are arranged 19 CCD elements 35a on each of the vertical CCD transfer paths 35, under which the horizontal CCD transfer path 37 is arranged. Therefore, the latest image signals for 20 sheets of pictures are always overwritten and stored.

When a phenomenon the recording is aiming at arises, the vertical transfer is stopped, and the image signals stored on the horizontal CCDs 37 are sent to the horizontal direction, and the image signals are read-out one by one through a reading circuit.

Then, the horizontal transfer is performed every time when the vertical transfer is performed once, in the same manner as in the operation of an ordinary CCD type image sensor, so as to read all the image signals in the vertical transfer paths.

Second Embodiment

Figure 6:
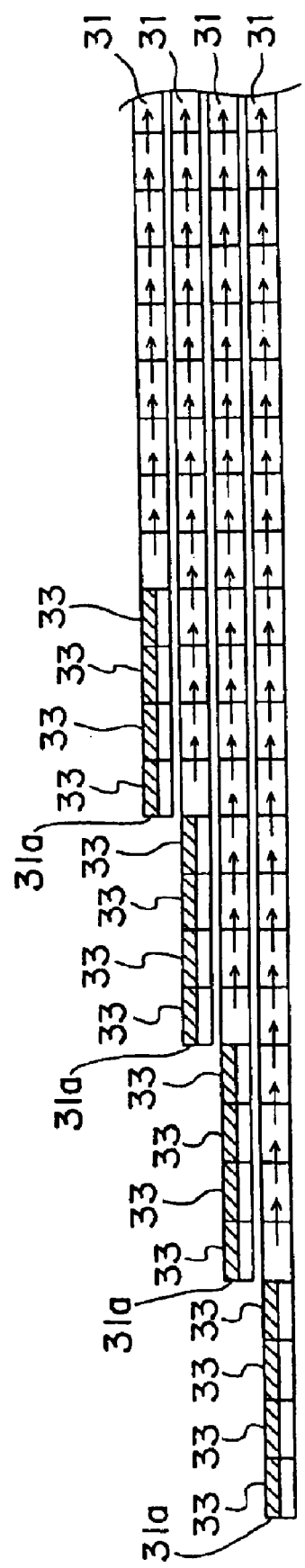
FIG. 6 is a schematic side view of an image sensor according to the second embodiment.
Figure 7:
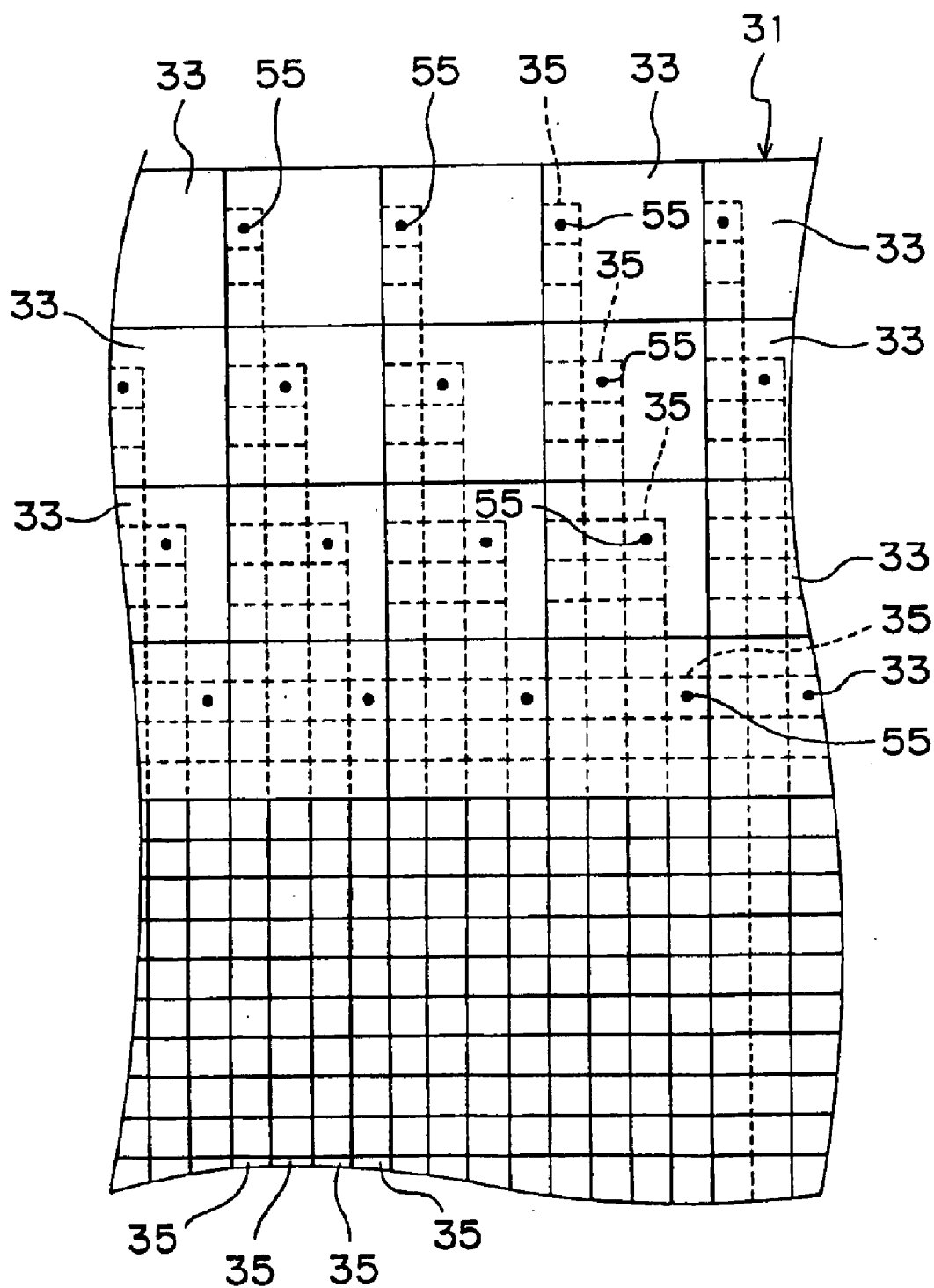
FIG. 7 is a partial plan view of one of chips comprised in the image sensor according to the second embodiment.

FIGS. 6 and 7 show the second embodiment of the present invention.

In the second embodiment, the chip 31 is a lamination type CCD element. Four rows of photodiodes 33 are arranged on top of the end portion of the vertical CCD transfer paths, and an input is fed to the face of the underlying CCD via the input gate 55. Therefore, the number of chips 31 necessary to have the same number of entire pixels of the first embodiment is a quarter of 128, that is, 32. Further, the number of reading lines is 32 in total in which every 16 reading lines are assigned to the right and left sides. The pitch between each of the pixels is 40 microns. The pitch between each of the CCDs is 10 microns both in the vertical and horizontal directions, with respect to the arrangement direction of the pixels. The number of image frames for continuous recording is 1,024. Other construction and operations of the second embodiment are the same as in the first embodiment as above.

Figure 8:
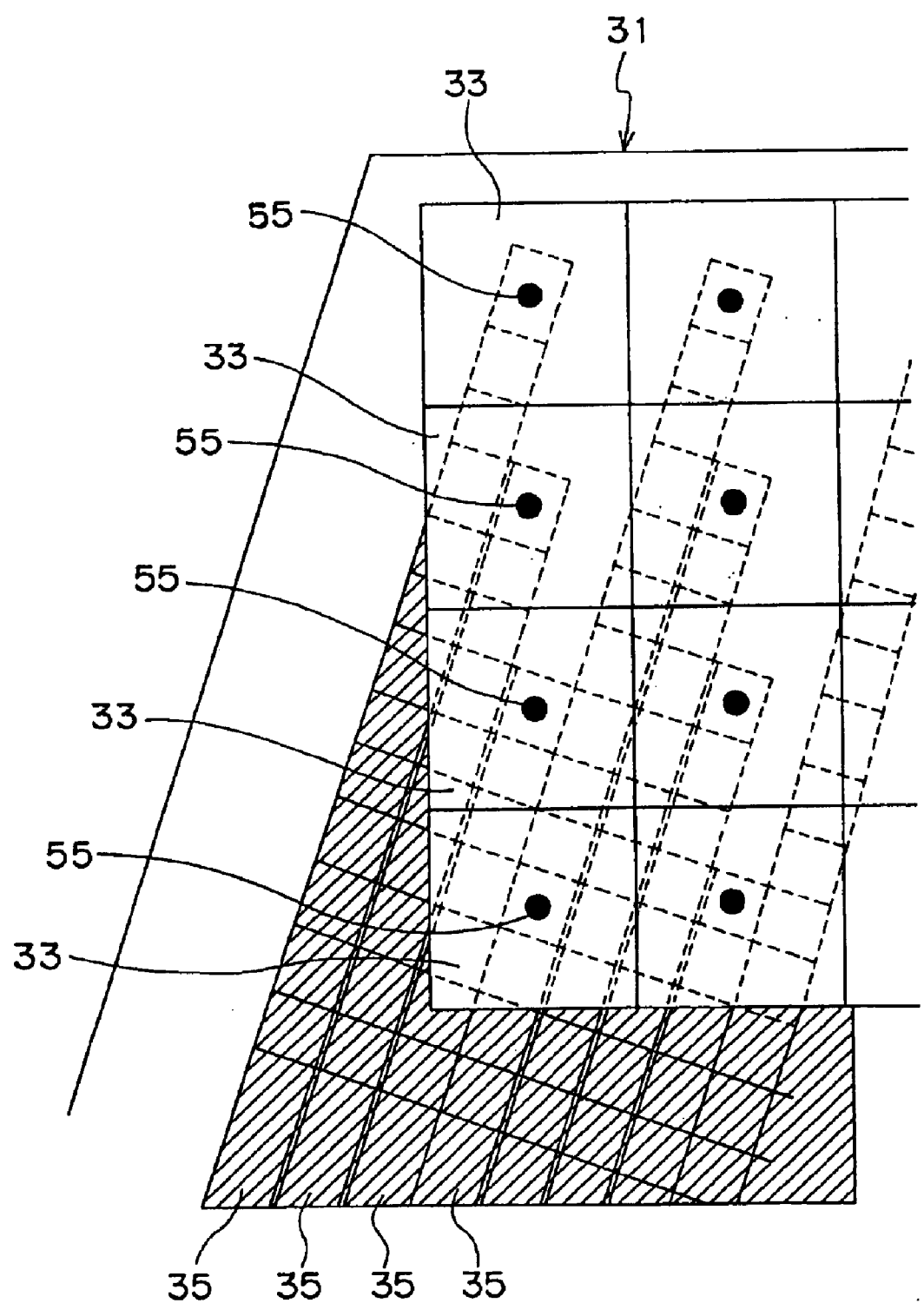
FIG. 8 is a partial plan view of a modification of the second embodiment.
Figure 9:
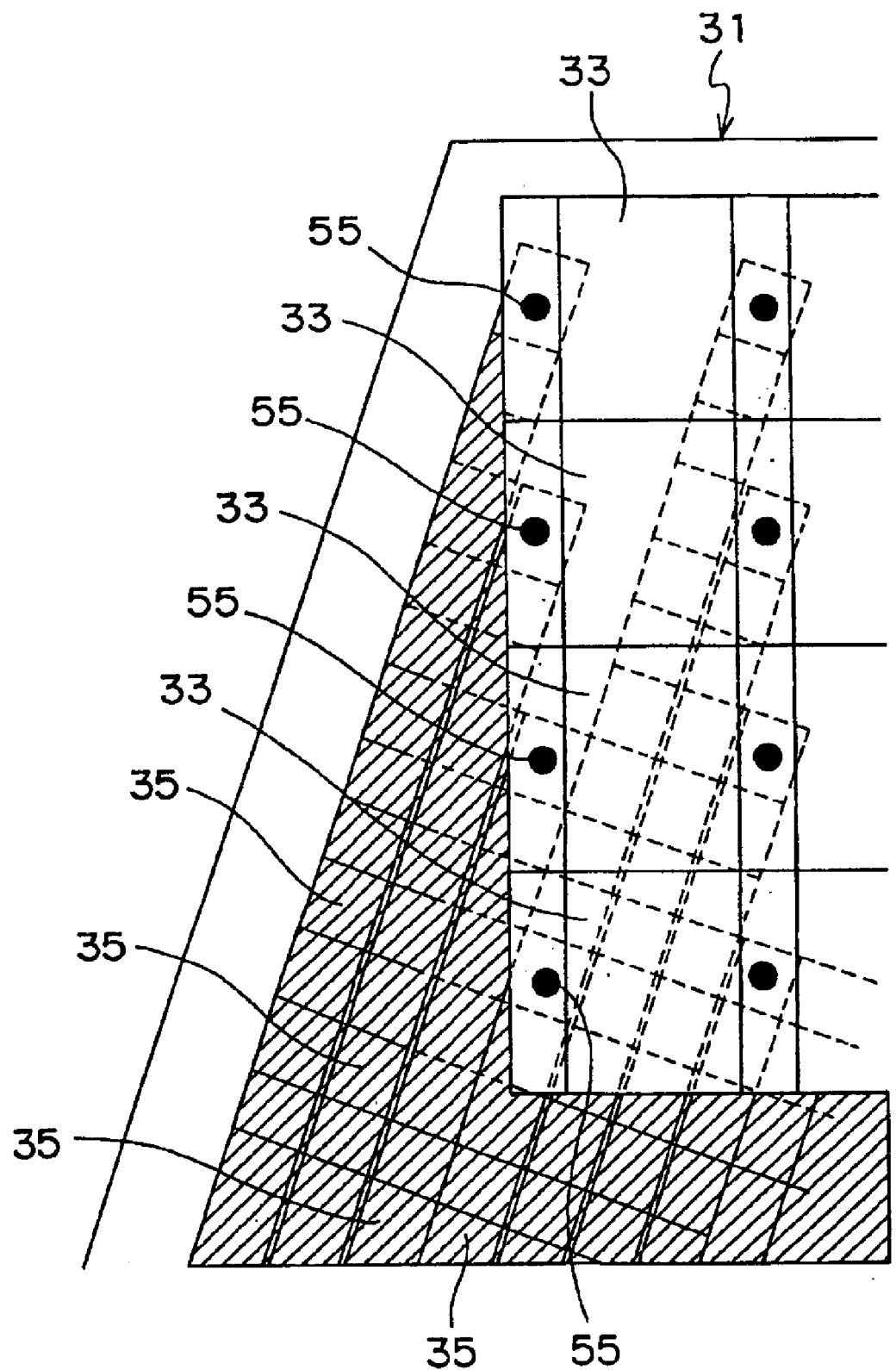
FIG. 9 is a partial plan view of another modification of the second embodiment.

FIGS. 8 and 9 show modifications of the second embodiment.

In these modifications, the axial lines of the arrays of pixels are not in parallel to the axial lines of the vertical CCD transfer paths 35, but diagonally cross the same. Therefore, the positional relationships between the photoelectric converting faces and the input gates 55 to the CCDs are the same with respect to all corresponding pixels. Thus, it is possible to minimize the generation of false signals while keeping the regular square pixel arrangement. In FIG. 8, the input gates 55 are respectively arranged in the vicinity of the centers of the photodiodes 33, viewed from just above. On the other hand, in FIG. 9, the input gates 55 are arranged in the vicinity of one sides of the photodiodes 33.

Third Embodiment

Figure 10:
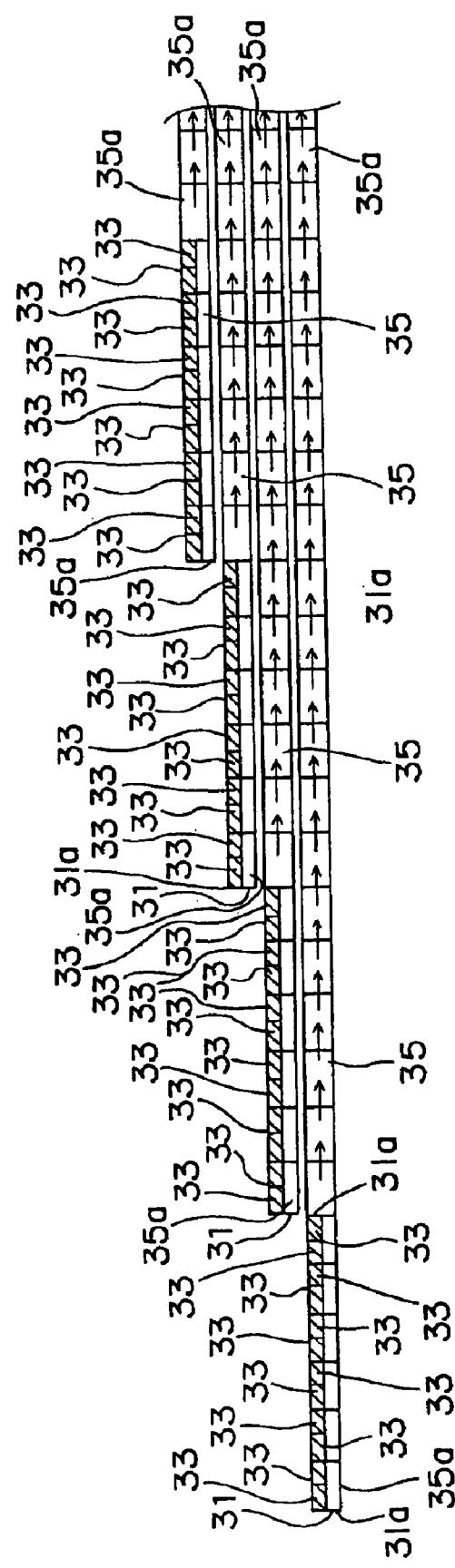
FIG. 10 is a schematic side view of an image sensor according to the third embodiment.
Figure 11:
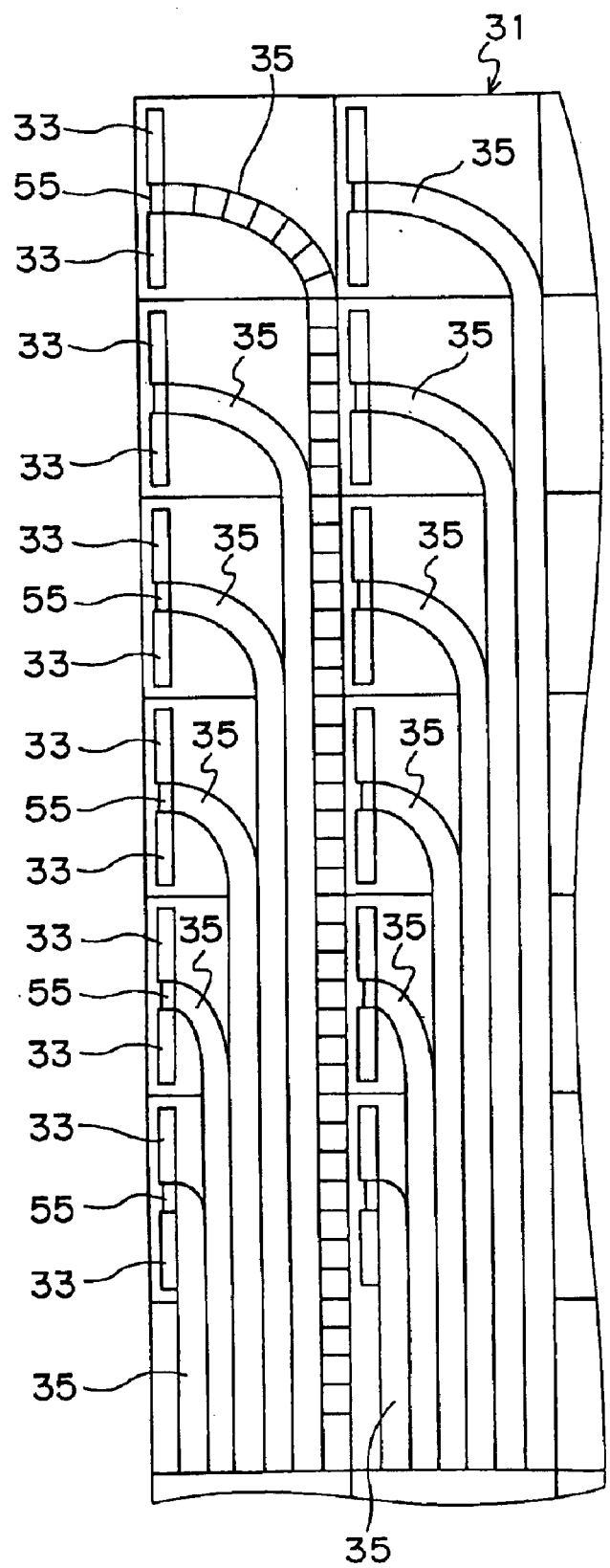
FIG. 11 is a schematic plan view of the image sensor according to the third embodiment.

FIGS. 10 and 11 show the third embodiment of the present invention.

In the third embodiment, the chip 31 is of an inter line type. Paired photodiodes 33 arranged at one end portion of each vertical CCD transfer paths 35 form six rows. Each pair of photodiodes 33 is connected to the vertical CCD transfer path 35 via the input gate 55.

In the third embodiment, the number of chips 31 necessary to have the same number of entire pixels as that of the first embodiment is one sixth of the number of the chips 31 of the first embodiment. The pitch between each of the pixels is 35 microns, and the pitch between each of the CCDs is 5 microns both in the vertical and horizontal directions with respect to the arrangement direction of the pixels. Other construction and operations of the third embodiment are the same as in the first embodiment.

Fourth Embodiment

Figure 12:
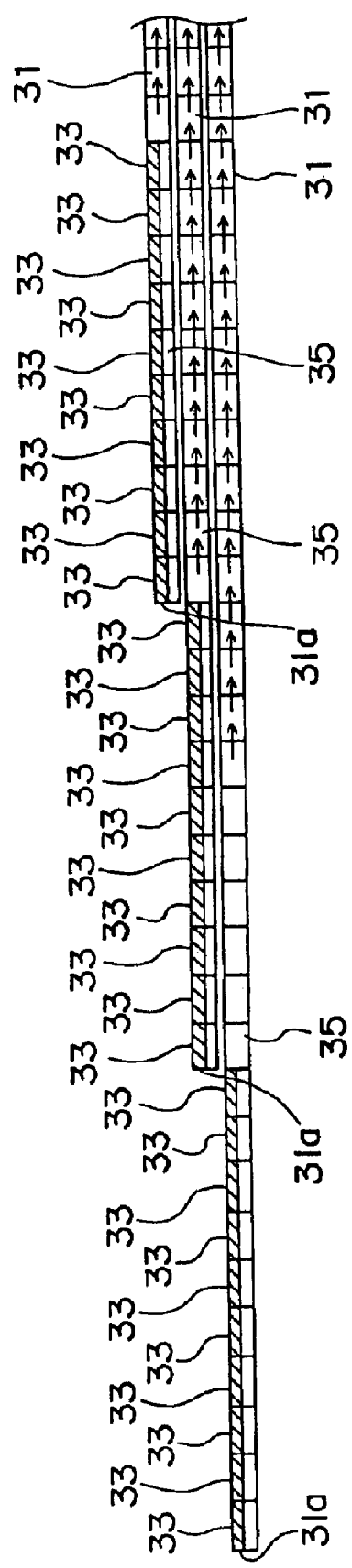
FIG. 12 is a schematic side view of an image sensor according to the fourth embodiment.
Figure 13:
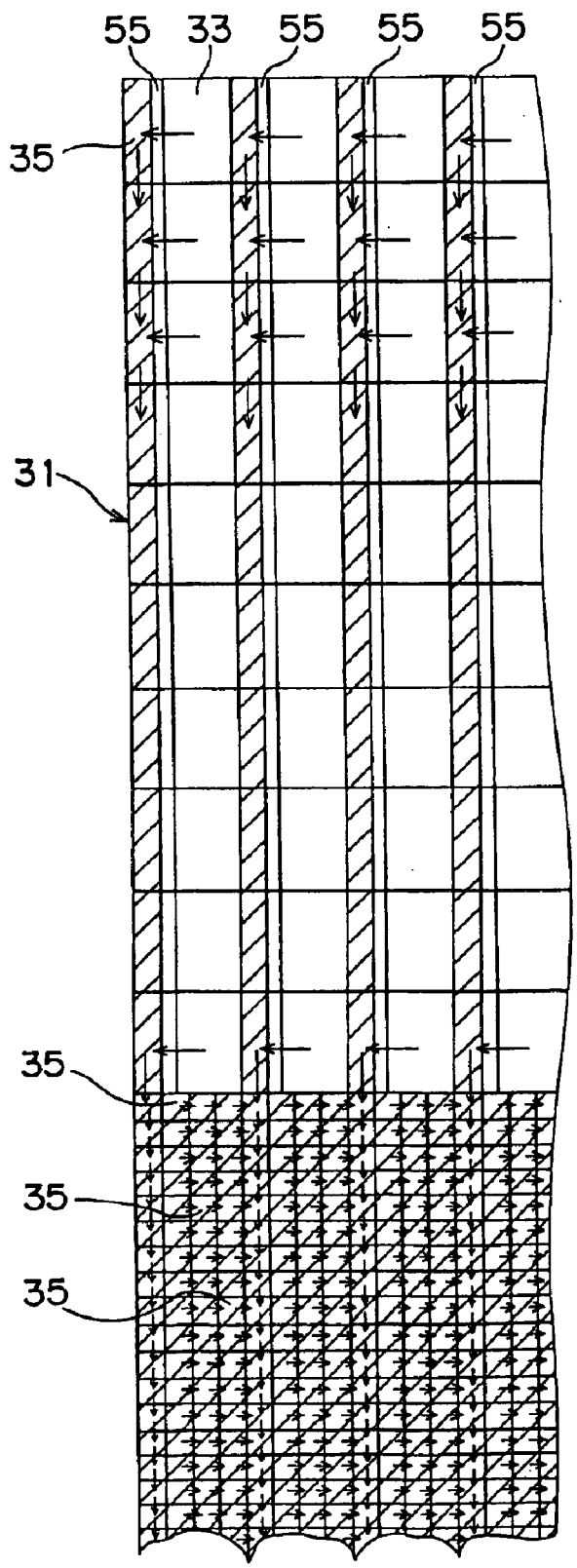
FIG. 13 is a partial plan view of the image sensor according to the fourth embodiment.

FIGS. 12 and 13 show the fourth embodiment of the present invention.

In the fourth embodiment, the chip 31 is of an inter line type. Ten rows of photodiodes 33 are arranged upper portion of the chip 31. Ten photodiodes 33 composing the longitudinal row in FIG. 13 are respectively connected to a single vertical CCD transfer path 35 via the input gate 55. As shown in FIG. 13, under the ten rows of photodiodes 33, each three vertical CCD transfer paths 35 are provided between each of the vertical CCD transfer paths 35 which are connected to the photodiodes 33.

Further, a drain (not drawn) is arranged at the lower side, and a CCD transfer path for use in reading (not drawn) is arranged at the right side in FIG. 13.

In this embodiment, 100 chips 31 are arranged, and the pitch between each of the pixels is 20 microns. The photodiode 33 has a size of 20 microns (in the longitudinal direction) and 15 microns (in the lateral direction). The pitch between each of the vertical CCD transfer paths 35 is 5 microns.

During image sensing, the input gates 55 are opened for one two-millionth sec. while photoelectric conversion is performed in the ten photodiodes 33 arranged in the vertical direction in FIG. 13, resulting in that electric charges are transferred from the respective photodiodes 33 to the corresponding vertical CCD transfer paths 35. Simultaneously with this photoelectric conversion, the electric charges in the respective vertical CCD transfer paths 35 are transferred in 10 steps at 20 MHz (advancing one step per one twenty-millionth sec.). It takes one two-millionth sec. in transferring the electric charges in 10 steps. Accordingly, continuous images entered the gate every one millionth sec. are stored, and the recording speed is one million sheets per sec. Other construction and operations of the fourth embodiment are the same as in the first embodiment.

Fifth Embodiment

Figure 14:
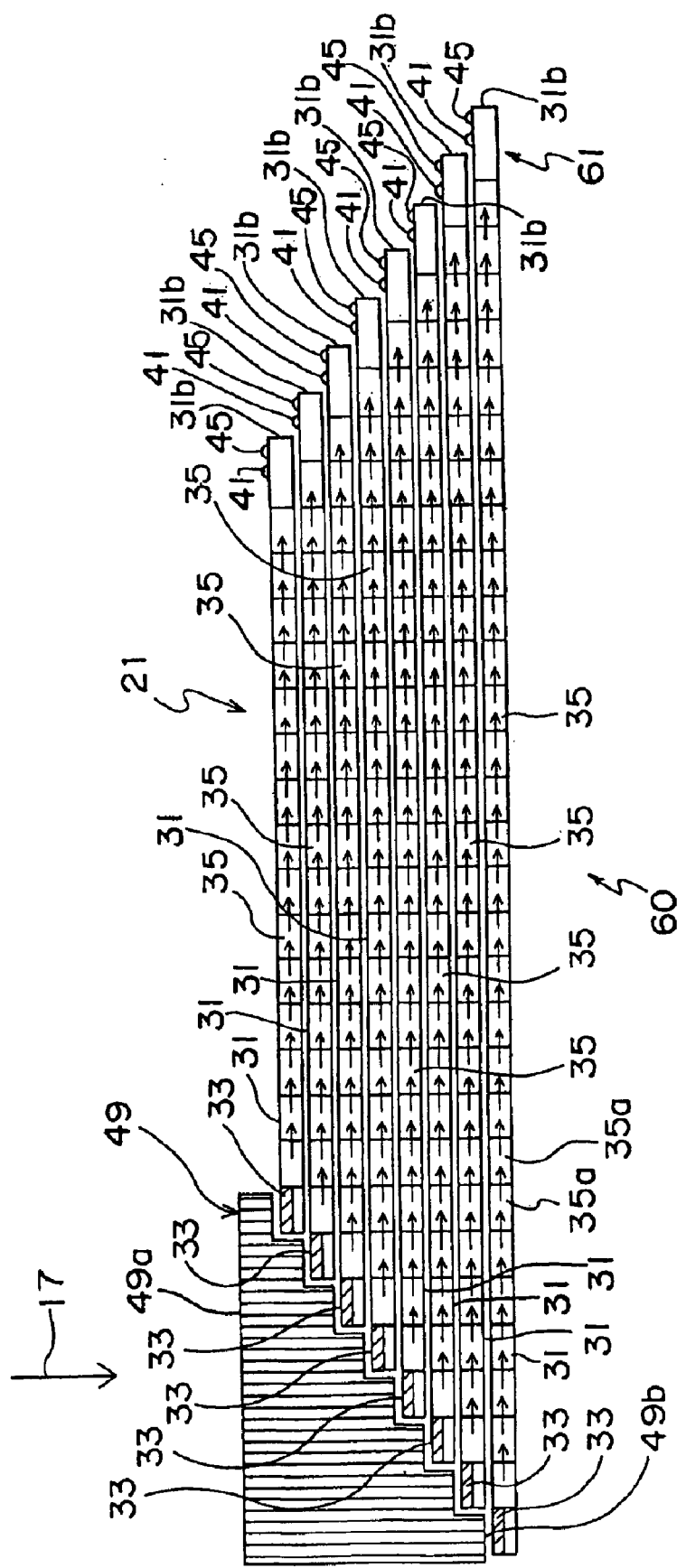
FIG. 14 is a schematic side view of an image sensor according to the fifth embodiment.
Figure 15:
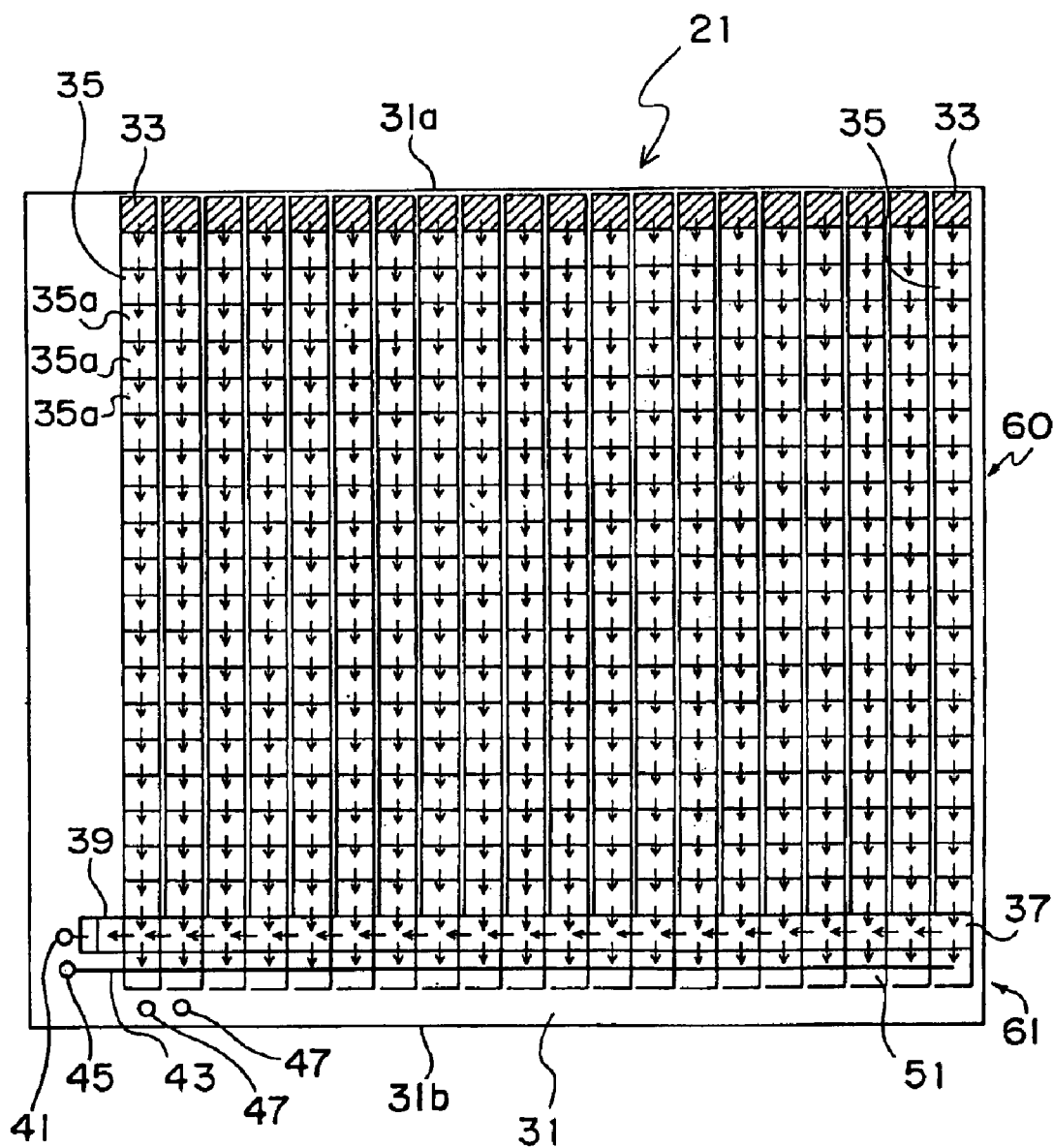
FIG. 15 is a plan view of one of chips comprised in the image sensor according to the fifth embodiment.

FIGS. 14 and 15 show the fifth embodiment of the present invention.

In the fifth embodiment, the read-out terminal 41, the drain terminal 45 and other terminals 47 are arranged, not on the end face of the chip 31, but in the vicinity of the second end portion 31b of the same plane of the chip 31 on which the photodiode 33 is arranged. Further, the length from the first end portion 31a to the second end portion 31b of the chip 31 is shorter as the relevant chip 31 is closer to the incoming side for light beam 17 (the upper layer side in FIG. 14). By varying the length of the chips 31, the second end portion 31b of each chip 31 is shifted to the right in FIG. 16 relative to the second end portion 31b of an adjacent chip 31 on the side of the upper layers in FIG. 16. Thus, the input/output section 61 of each chip 31 including the read-out terminal 41, the drain terminal 45 and other terminals 47 is stepwise exposed.

The stepwise exposure of the input/output sections 61 of the respective chips facilitates the connection of electric wires for outputting electric signals or supplying drive voltage to the read-out terminals 41, the drain terminals 45 and other terminals 47.

In some cases, the end face of the chip 31 has irregular crystalline orientation because the end face of the chip is generally a diced section of a wafer. Therefore, noises tend to occur on the read-out terminal 41, the drain terminal 45 and other terminals 47 which are arranged on the end face of the chip 31, particularly when analog signals are inputted or outputted. To overcome such a disadvantage, according to the fifth embodiment, the read-out terminal 41, the drain terminal 45 and other terminals 47 are arranged on one side of the chip 31, but not on the end face of the chip 31. Thus, it becomes possible to reduce such noises that occur in the above-mentioned terminals. Other construction and operations of the fifth embodiment are the same as in the first embodiment.

Figure 16:
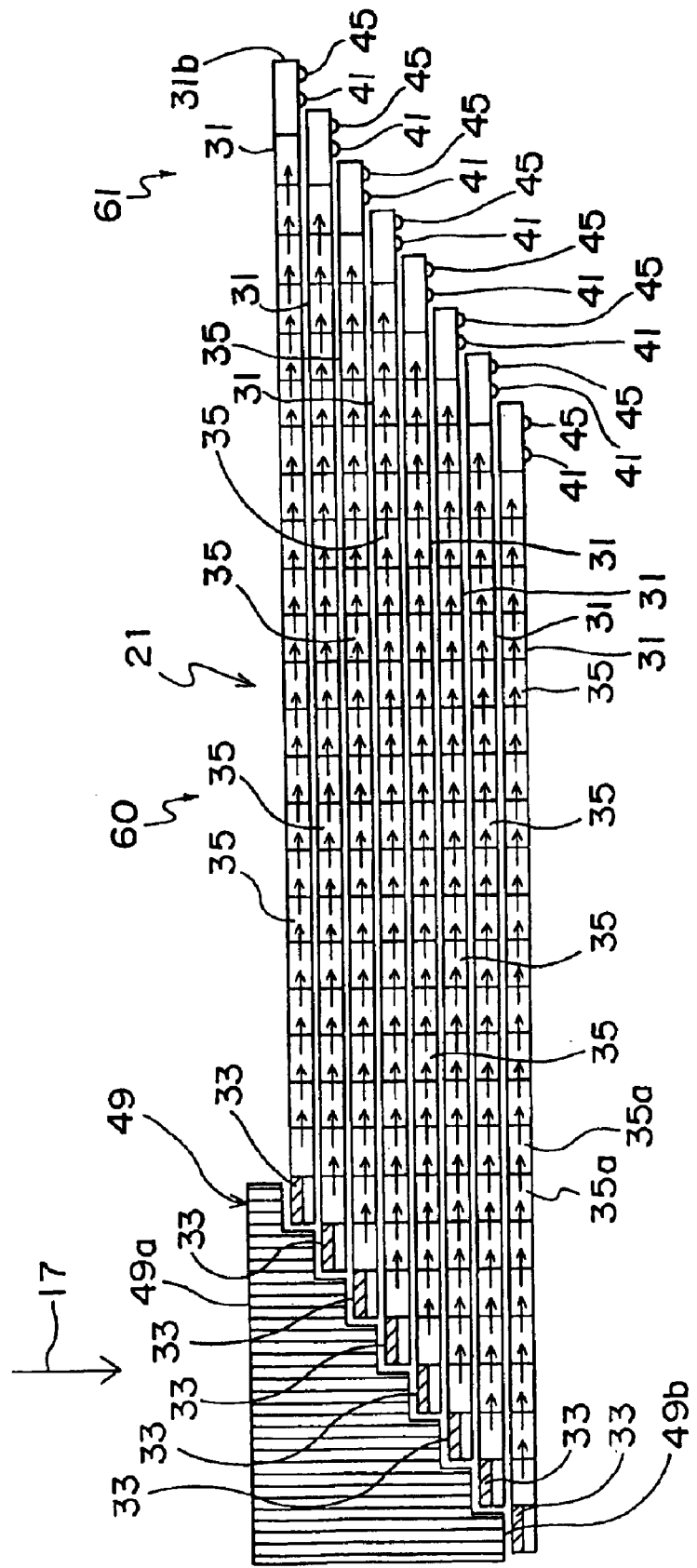
FIG. 16 is a schematic side view of a modification of the image sensor according to the fifth embodiment.
Figure 17:
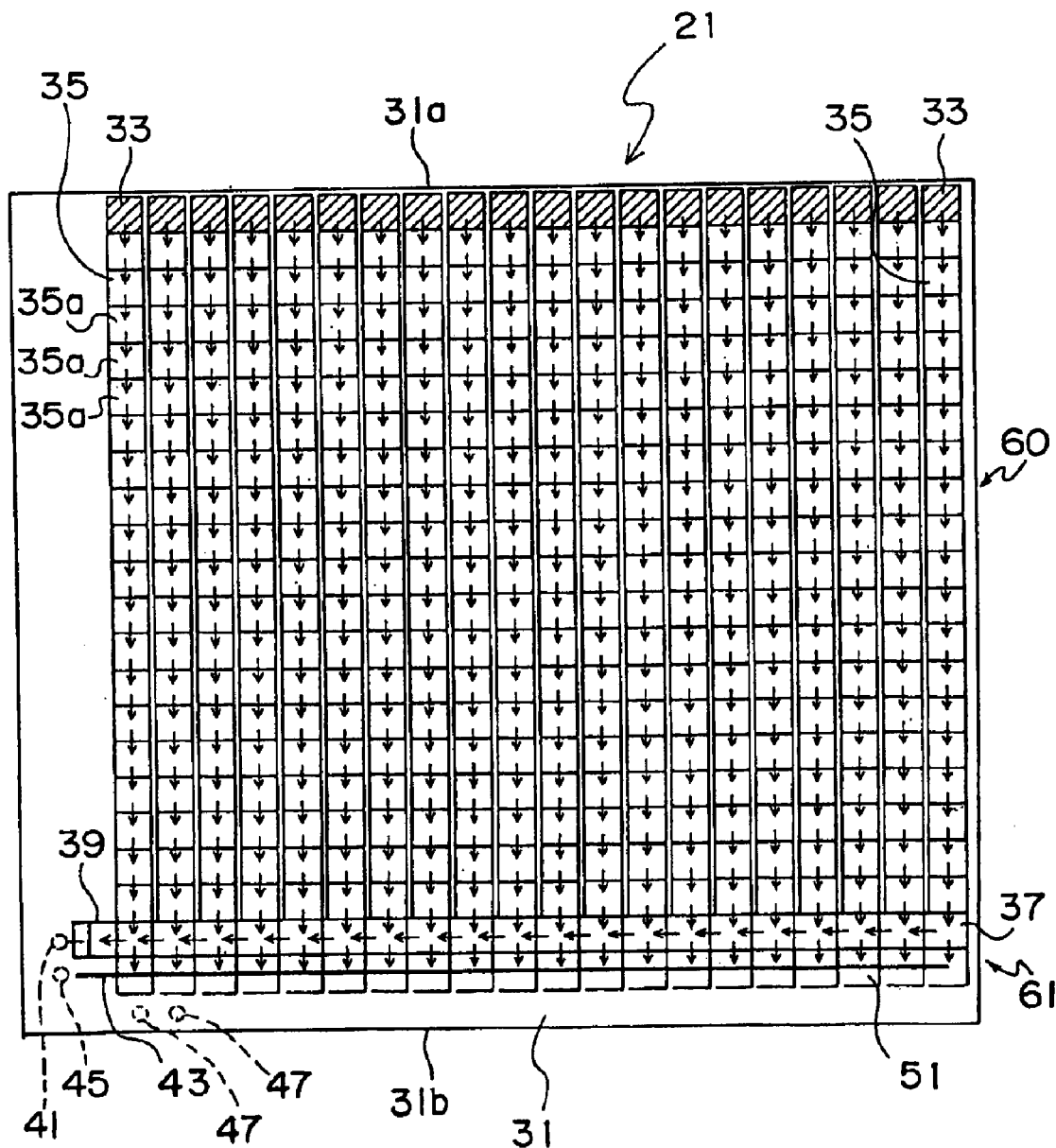
FIG. 17 is a partial plan view of one of chips comprised in the modification of the image sensor according to the fifth embodiment.
Figure 18:
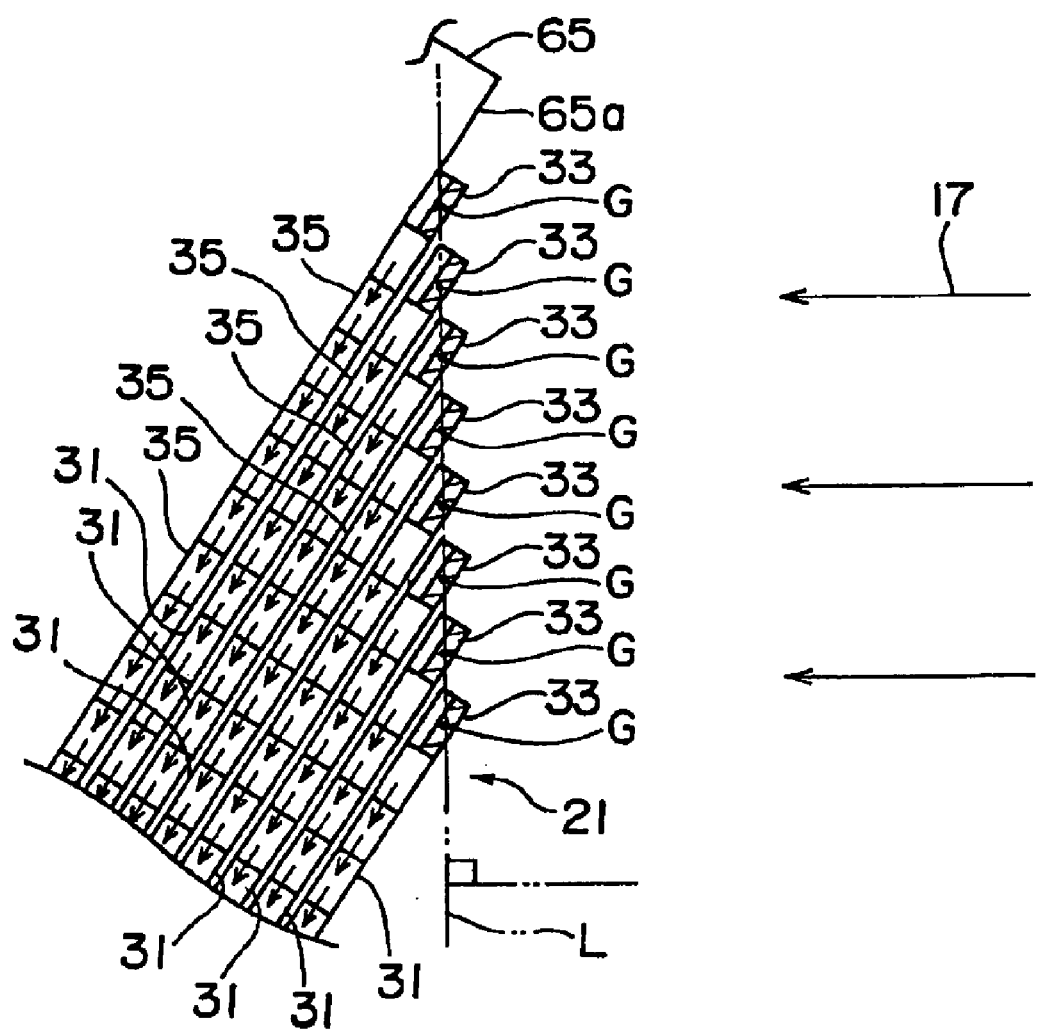
FIG. 18 is a partial side view of the image sensor which is inclined with respect to the incident direction of light beam.
Figure 19:
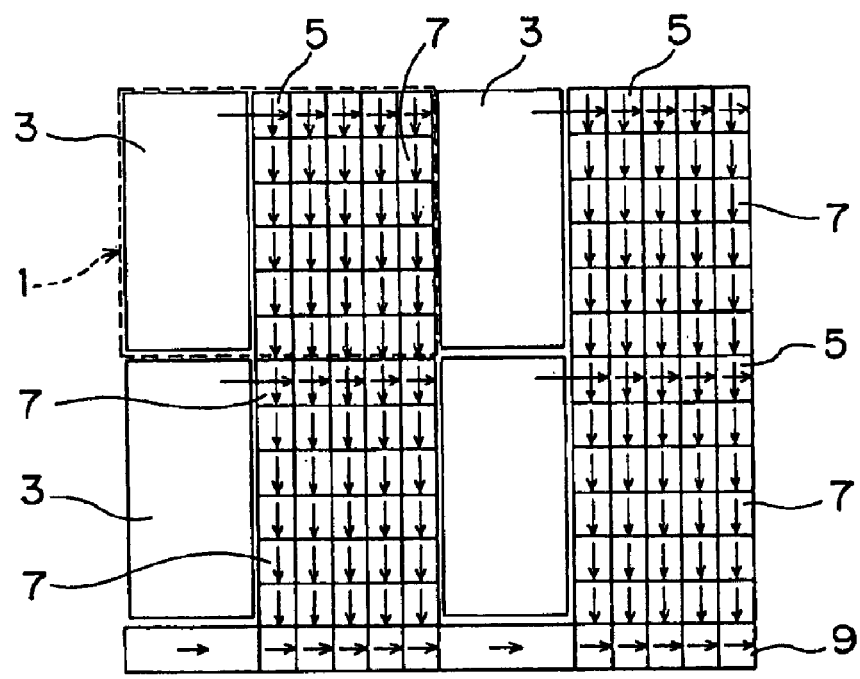
FIG. 19 is a partial plan view of an example of the conventional image sensors.
Figure 20:
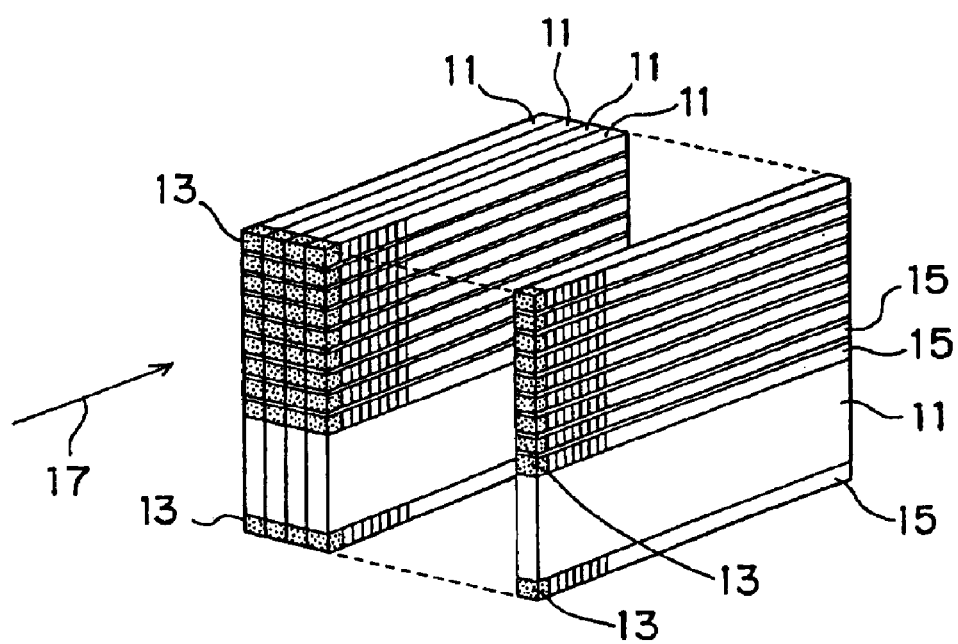
FIG. 20 is a schematic side view of another example of the conventional image sensors.

As shown in FIGS. 16 and 17, the input/output section 61 including the read-out terminal 41, the drain terminal 45 and other terminals 47 may be arranged in the vicinity of the second end portion 31b of the reverse side of the plane of the chip 31 on which the photodiode 33 is arranged. Due to such construction, the second end portion 31b of each chip 31 is shifted to the right in FIG. 16 relative to the second end portion 31b of an adjacent chip 31 which is arranged in the underlying layer. In this case, owing to the stepwise exposure of the input/output section 61, it becomes easy to connect various wires to the read-out terminal 41, the drain terminal 45 and other terminals 47, and also, it becomes possible to reduce noises which occur in these terminals.

The foregoing embodiments should not be construed as limiting the scope of the present invention, and various modifications thereof are of course possible. For example, there may be used such a converter, other than the photodiode, that can convert infrared rays, ultraviolet rays, X-rays, electron beams, ion lines, neutrons, supersonic waves or other incident beams into electric signals. In these cases, it becomes possible to record continuous images which are formed by infrared rays, ultraviolet rays, X-rays, electron beams, ion lines, neutrons or supersonic waves at very high speed.

It is also possible to adhere a micro lens array to the image-forming face of the fiber glass.

It is also possible to coat the image-forming face of the fiber glass with a film for converting an image formed by a factor other than light into a light image, such as a short time response X-ray fluorescent film or the like.

The parallel processing section is not always composed of the photodiodes and the CCDs for storing electric signals as in the foregoing embodiments. For example, an AD converter may be provided between the converter such as a photodiode and a digital type electric signal-storage. Further, the parallel processing section may have a function of processing digital signals or analog signals.

On-chip micro lenses may be mounted on the converts such as photodiodes. In this case, the focal length of each on-chip micro lens is adjusted to thereby correct the influence resulting from the stepwise arrangement of the converts.

In case where the fiber glass is not provided, a mount surface 65a of a package 65 on which the image sensor 21 is mounted is inclined relative to the incident direction of the light beam 17, so that the photo-receptive area, composed of the row of photodiodes 33 which are stepwise exposed, is inclined relative to the incident direction of the light 17. In this case, it is preferable that line L connecting the centers G of each row of photodiodes 33 viewed from the sides should be perpendicular to the incident direction of light beam 17. In such a case, the distance between the optical system such as the lens 21 (see FIG. 1) and each of the photodiodes 33 is uniform as compared with the case where the photo-receptive area is set up to be perpendicular to the incident direction of light 17. Thus, it is possible to correct the influence resulting from the stepwise arrangement of the photodiodes 33.

Also, it is possible to incline the row of photodiodes 33 to the incident direction of light 17 by mounting the package 65 on the body of the image sensing apparatus, inclining thereto.

Further, the image sensor may be cooled. In this case, it is possible to reduce noises and also to increase the holding time of the stored electric signals.

The image sensing apparatus comprising the image sensor of the present invention is used for not only high-speed image sensing but also recording a plurality of still pictures in the electric signal-storage.

The structure of the image sensor of the present invention in which a plurality of chips are laminated can be applied to various circuit elements for use in parallel processing. In detail, a circuit element is constructed as follows: a plurality of chips each having a parallel processing section which is arranged between the vicinity of the first end portion and the second end portion opposite to the first end portion and an input/output section arranged in the vicinity of the second end portion are laminated to construct the circuit element. Then, the first end portion of each chip is shifted relative to the first end portion of an adjacent chip so that the parallel processing sections of the respective chips can be partially and stepwise exposed. Further, the second end portion of each chip is shifted relative to the second end portion of the adjacent chip so that the input/output sections of the respective chips can be stepwise exposed. It is possible to connect this circuit element to external circuits with low noises because the input/output sections of the respective chips are stepwise exposed.

An example of the circuit element of this type is a sensor which performs after the model of the function of the human nerves from the retina of the eyes to the brain. A plurality of steps of process are required for the human brain to recognize an image which is formed on the retina. It is preferable that the sensor itself performs initial or simple processes among the above required processes. The structure of the present invention in which the chips are laminated on one another makes it possible to execute these processes in the parallel processing sections of the chips.

What is claimed is:

1. An image sensor, comprising:
  a plurality of chips;
  each of the plurality of chips respectively having:
    a plurality of converters for converting incident beams into electric signals;
    a plurality of electric signal storages; and
    an input/output section,
  said converters being arranged in a plurality of rows in the vicinity of a first end portion of the chip,
  said electric signal storages respectively having electric signal-storage elements for storing said electric signals, each electric signal storage extending from the plurality of converters to a second end portion opposite to the first end portion of the chip, and
  said input/output section being arranged in the vicinity of the second end portion of the chip,
  wherein the first end portion of each chip is shifted relative to the first end portion of an adjacent chip so that the row of the converters of the respective chips are stepwise exposed,
  wherein the second end portion of each chip is shifted relative to the second end portion of an adjacent chip so that the input/output sections of the respective chips are stepwise exposed,
  wherein said plurality of converters are arranged above an end portion of each respective electric signal storage, and
  wherein each electric signal storage is arranged diagonally across the arrangement of said plurality of converters such that each converter is connected in the same position to an input gate of a respective electric signal storage.

2. An image sensor as in claim 1, wherein said incident beams are visible rays.

3. An image sensor as in claim 1, wherein said incident beams are infrared rays, ultraviolet rays, X-rays, electron lines, ion beams, neuron lines or supersonic waves.

4. The image sensor as in claim 1, wherein the exposed converters of the respective chips are inclined with respect to the incident direction of the incident beams.

5. An image sensor as in claim 1, wherein pairs of said converters associated with pairs of rows are connected to an input gate of an electric signal storage.

6. An image sensor as in claim 1, wherein an input gate connects each of the plurality of converters, one from each row along a column, to a single electric signal storage, and a plurality of other electric signal storage are provided between the electric signal storage connected to the converters.

7. An image sensor, comprising:
  a plurality of semiconductor chips:
  each of the plurality of semiconductor chips respectively having;
    a plurality of converters for converting incident beams into electric signals;
    a plurality of electric signal storages; and
    an input/output section,
  said converters being arranged in one row in the vicinity of a first end portion of the semiconductor chip,
  said electric signal storages respectively having electric signal-storage elements for storing said electric signals, each electric signal storage extending from the converter to a second end portion opposite to the first end portion of the semiconductor chip, and
  said input/output section being arranged in the vicinity of the second end portion of the semiconductor chip; and
  a fiber glass which has a planar incident face and a stepwise outgoing face, said outgoing face being tightly contacted with the row of the converters of the respective chips,
  wherein the first end portion of each semiconductor chip is shifted relative to the first end portion of an adjacent semiconductor chip so that the row of the converters of the respective semiconductor chips are stepwise exposed, and
  wherein the second end portion of each semiconductor chip is shifted relative to the second end portion of an adjacent semiconductor chip so that the input/output sections of the respective semiconductor chips are stepwise exposed.

8. An image sensor as in claim 7, wherein said incident beams are visible rays.

9. An image sensor as in claim 7, wherein said incident beams are infrared rays, ultraviolet rays, X-rays, electron lines, ion beams, neuron lines or supersonic waves.

10. An image sensing apparatus, comprising:
an image sensor comprising:
a plurality of chips;
said chips respectively having
a plurality of converters for converting incident beams into electric signals;
a plurality of electric signal storages; and
an input/output section,
said converters being arranged in a plurality of rows in the vicinity of a first end portion of the chip,
said electric signal storages respectively having electric signal-storage elements for storing said electric signals, each electric signal storage extending from the converters to a second end portion opposite to the first end portion of the chip, and
said input/output section being arranged in the vicinity of the second end portion of the chip,
wherein the first end portion of each chip is shifted relative to the first end portion of an adjacent chip so that the row of the converters of the respective chips are stepwise exposed,
wherein the second end portion of each chip is shifted relative to the second end portion of an adjacent chip so that the input/output sections of the respective chips are stepwise exposed,
wherein said plurality of converters are arranged above an end portion of each respective electric signal storage, and
wherein each electric signal storage is arranged diagonally across the arrangement of said plurality of converters such that each converter is connected in the same position to an input gate of a respective electric signal storage.

* * * * *